(12) United States Patent
Uckert et al.

(10) Patent No.: US 7,214,763 B2
(45) Date of Patent: May 8, 2007

(54) ELECTROACTIVE FLUORENE COPOLYMERS AND DEVICES MADE WITH SUCH POLYMERS

(75) Inventors: Frank P. Uckert, Santa Barbara, CA (US); Howard E. Simmons, III, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 247 days.

(21) Appl. No.: 10/809,657

(22) Filed: Mar. 25, 2004

(65) Prior Publication Data

US 2004/0181021 A1 Sep. 16, 2004

Related U.S. Application Data

(62) Division of application No. 10/137,898, filed on May 2, 2002, now Pat. No. 7,074,885.

(60) Provisional application No. 60/288,314, filed on May 3, 2001.

(51) Int. Cl.
  *C08G 65/00* (2006.01)
(52) U.S. Cl. ............... 528/408; 428/405; 428/397; 428/488; 252/301.16
(58) Field of Classification Search ............ 526/281, 526/346, 280; 528/405, 408, 397, 488; 252/301.16
See application file for complete search history.

(56) References Cited

U.S. PATENT DOCUMENTS

| | | | |
|---|---|---|---|
| 4,508,639 A | 4/1985 | Camps et al. | |
| 5,621,131 A * | 4/1997 | Kreuder et al. | 558/46 |
| 5,708,130 A | 1/1998 | Woo et al. | |
| 5,763,636 A * | 6/1998 | Kreuder et al. | 558/46 |
| 5,777,070 A * | 7/1998 | Inbasekaran et al. | 528/394 |
| 5,807,974 A * | 9/1998 | Kim et al. | 528/366 |
| 5,814,244 A | 9/1998 | Kreuder et al. | |
| 5,821,002 A | 10/1998 | Ohnishi et al. | |
| 5,856,434 A | 1/1999 | Stern et al. | |
| 5,876,864 A * | 3/1999 | Kim et al. | 428/690 |
| 5,900,327 A | 5/1999 | Pei et al. | |
| 5,962,631 A * | 10/1999 | Woo et al. | 528/397 |
| 5,998,045 A | 12/1999 | Chen et al. | |
| 6,169,163 B1 | 1/2001 | Woo et al. | |
| 6,204,515 B1 | 3/2001 | Bernius et al. | |
| 6,309,763 B1 | 10/2001 | Woo et al. | |
| 6,353,083 B1 | 3/2002 | Inbasekaran et al. | |
| 6,541,602 B1 | 4/2003 | Spreitzer et al. | |
| 6,605,373 B2 | 8/2003 | Woo et al. | |
| 6,653,438 B1 | 11/2003 | Spreitzer et al. | |

FOREIGN PATENT DOCUMENTS

| | | |
|---|---|---|
| EP | 0 259 229 B1 | 9/1987 |
| EP | 0 956 312 B1 | 1/1998 |
| WO | WO 99/54385 A1 | 10/1999 |
| WO | WO 99/54943 A1 | 10/1999 |
| WO | WO 00/22027 A1 | 4/2000 |
| WO | WO 00/46321 A1 | 8/2000 |
| WO | WO 00/53656 A1 | 9/2000 |
| WO | WO 00/55927 A1 | 9/2000 |
| WO | WO 01/07502 A2 | 2/2001 |
| WO | WO 01/42331 A1 | 6/2001 |
| WO | WO 01/77203 A2 | 10/2001 |
| WO | WO 01/81294 A1 | 11/2001 |
| WO | WO 02/066537 A1 | 8/2002 |

OTHER PUBLICATIONS

Miller et al., Nonlinear Optics, 20, 269-295(1999).*
DE 19846767, Partially conjugated polymer useful as an organic semiconductor or an electroluminescence material, and for display elements in television monitor and illumination technology contains fluorene building units. Abstract, Jun. 13, 2000, Aventis Res & Technologies Gmbh.
JP 2000319272. (Diarylamino) furan analogues with improved stability, useful pharmaceutical intermediates and electron hole transport or photosensitive materials, Abstract, Apr. 21, 2001, Tosoh Corp.
JP 08157575, Carrier transport polymers—useful as carrier transport materials in organic thin film electroluminescence devices, Abstract, Oct. 25, 1996, Toppan Printing Co. Ltd.
JP 2000143778, Display element such as cathode ray tube and light emitting diode, comprises specified light emitting compound as color developing materials, Abstract, Oct. 6, 2000, Samsung Denkan KK.
JP 10273522. Production of phenylene group-containing copolymers—comprises copolymerizing phenylene group-containing compounds in presence of catalysts containing transition metal compounds, Abstract, Jan. 13, 1999, Nippon Gosei Gomu KK.
JP 10273521, Production of phenylene group-containing copolymers—comprises copolymerizing phenylene group-containing compounds in presence of catalysts containing transition metal compounds, Abstract, Dec. 23, 1999, Nippon Gosei Gomu KK.
JP 03028220, Electrochromic elements for display or optical shield glass—contg. film of polyphenylene polymer derived from fluorene, Abstract, Sep. 28, 1993, Idemitsu Kosan Co. Ltd.
JP 03017120, Polyphenylene polymers used as conductive material or display material are produced by chemical or electrochemical-oxidative polymerizing of specified fluorene derivs, Abstract, Sep. 28, 1993, Idemitsu Kosan Co. Ltd.
JP 02269734, New polyphenylene-type polymer prepd. By oxidn. Polymerization of fluroene derive., Abstract, Sep. 28, 1993, Idemitsu Kosan Co. Ltd.
KR 99057430, Fluorene-based alternating statistical copolymer containing multi-luminescence groups and electroluminescence device using the same, Abstract, Jul. 15, 1999, Korea Adv Inst Sci & Technology.

(Continued)

Primary Examiner—Ling-Sui Choi
(74) Attorney, Agent, or Firm—John H. Lamming

(57) ABSTRACT

The present invention is generally directed to copolymers of fluorene. It further relates to devices that are made with the copolymers.

16 Claims, 11 Drawing Sheets

OTHER PUBLICATIONS

Cowell, Allan B. et al., Fluoroalkylation of Aromatic Compounds, Journal of Fluorine Chemistry, 17, 1981, 345-356, Elsevier Sequola S.A., Lausanne, The Netherlands.

Kamigata, Nobumasa et al., Direct Perfluoroalkylation of Aromatic and Heteroaromatic Compounds with Perfluoroalkanesulfonyl Chlorides Catalysed by a Ruthenium (II) Phosphine Complex, J. Chem. Soc.Perkin Trans., 1, 1994, 1339-1346.

Korean Patent Abstracts, KR 00245841 B1, Fluorene-Based Alternating-Statistical Copolymer Containing Multi-Luminescence Groups and Electroluminescence Device Using The Copolymer, Dec. 1, 1999, Korea Institute of Science and Technology.

Kreyenschmidt M. et al., Thermally Stable Blue-Light-Emitting Copolymers of Poly(alkylfluorene), Macromolecules, 1998, 1099-1103, 31, American Chemical Society.

Lee, Jeong-Ik et al., Light-emitting electrochemical cells based on poly(9,9-bis(3,6-dioxaheptyl)-fluorene-2,7-diyl), Synthetic Metals, 2000, 195-197, 111-112, Elsevier Science S.A.

* cited by examiner (I)

I(a)

(II)

II(a)

II(b)

II(c)

II(d)

II(e)

II(f)

II(g)

II(h)

II(i)

II(j)

II(k)

II(l)

II(m)

II(n)

II(o)

II(p)

II(q)

II(r)

II(s)

II(t)   II(u)

II(v)   II(w)

II(x)  II(y)

II(z)

(III)

III(c)

III(d)

III(e)

III(f)

III(g)

IV

IV(a)    IV(b)

IV(c)    IV(d)

IV(e)    IV(f)

IV(g)    IV(h)

(V)

V(a)

V(b)

V(c)  V(d)

V(e)

(VI)

VI(a)

VI(b)

VI(c)

VI(d)

(VII)

VII(a)

(VIII)

(IX)

(X)

(XI)

(XII)

ELECTROACTIVE FLUORENE COPOLYMERS AND DEVICES MADE WITH SUCH POLYMERS

This application is a Divisional of U.S. application Ser. No. 10/137,898, filed May 2, 2002, now U.S. Pat. No. 7,074,885, which claims the benefit of 60/288,314, filed May 3, 2001.

BACKGROUND OF THE INVENTION

1. Field of the Invention

This invention relates to electroactive fluorene copolymers. The invention further relates to electronic devices in which the active layer includes such polymeric materials.

2. Description of the Related Art

Organic electronic devices such as devices that emit light, such as light-emitting diodes that make up displays, are present in many different kinds of electronic equipment. In all such devices, a photoactive layer is sandwiched between two electrical contact layers. At least one of the electrical contact layers is light-transmitting so that light can pass through the electrical contact layer. The photoactive layer emits light through the light-transmitting electrical contact layer upon application of electricity across the electrical contact layers.

It is well known to use organic electroluminescent compounds as the active component in light-emitting diodes. Simple organic molecules such as anthracene, thiadiazole derivatives, and coumarin derivatives are known to show electroluminescence. Several classes of luminescent polymers have also been disclosed. These include, for example, poly(1,4-phenylene vinylene) and derivatives; polythiophenes, especially, poly(3-alkylthiophenes); and poly(p-phenylenes). Alkyl and dialkyl derivatives of polyfluorene have also been disclosed, as in U.S. Pat. Nos. 5,708,130 and 5,900,327.

There is a continuing need for photoactive compounds having improved efficiency and processes for preparing them.

SUMMARY OF THE INVENTION

The present invention is directed to copolymers comprising at least one first monomeric unit and at least one second monomeric unit, wherein the at least one first monomeric unit has a Formula I shown in FIG. 1, and the at least one second monomeric unit is selected from (i) aromatic groups having Formula II shown in FIG. 2, (ii) 6-membered-ring heteroaromatic groups having Formula II, shown in FIG. 6; (iii) 5-membered-ring heteroaromatic groups having Formula IV, shown in FIG. 7; (iv) aromatic groups having Formula V, shown in FIG. 8, (v) fused ring aromatic groups having Formula VI, shown in FIG. 9, Formula VII, shown in FIG. 10, and Formula VII through Formula XI, shown in FIG. 11, and (vi) combinations thereof, where:

in each of Formulae I, II, III, IV, V, VI, VII, VIII through XI:

R is a substituent on a carbon atom which can be the same or different at each occurrence and is selected from hydrogen, alkyl, aryl, heteroalkyl, heteroaryl, F, —CN, —OR$^1$, —CO$_2$R$^1$, C$_\psi$H$_\theta$F$_\lambda$, —OC$_\psi$H$_\theta$F$_\lambda$, —SR$^1$, —N(R$^1$)$_2$, —P(R$^1$)$_2$, —SOR$^1$, —SO$_2$R$^1$, —NO$_2$, and beta-dicarbonyls having Formula XII shown in FIG. 12 and as further described below under "Formula XII"; or adjacent R groups together can form a 5- or 6-membered cycloalkyl, aryl, or heteroaryl ring, such that:

R$^1$ is a substituent on a heteroatom which can be the same or different at each occurrence and is selected from alkyl, aryl, heteroalkyl and heteroaryl; and $\psi$ is an integer between 1 and 20, and $\theta$ and $\lambda$ are integers satisfying Equation A1 below:

$$\theta+\lambda=2_\psi+1; \qquad \text{(Equation A1);}$$

in each of Formulae II, III, IV, V, VI, VII, VIII, and IX:

E can be the same or different at each occurrence and is a single bond or a linking group selected from arylene and heteroarylene;

in Formula IV:

A is independently at each occurrence C or N and γ is 0 or an integer selected from 1 or 2, such that when both A are N, then γ is 0; or when one of A is N and one of A is C, then γ is 1; or when both A are C, then γ is 2;

Q is O, S, SO$_2$, or NR$^1$ where:

R$^1$ is a substituent on a heteroatom which can be the same or different at each occurrence and is selected from alkyl, aryl, heteroalkyl and heteroaryl;

in Formula V:

Q$^1$ is a carbonyl group, O, S, SO$_2$, or NR$^1$ where:

R$^1$ is a substituent on a heteroatom which can be the same or different at each occurrence and is selected from alkyl, aryl, heteroalkyl and heteroaryl;

W is H, alkyl or heteroalkyl; or both of W together can represent one single bond;

in Formula VI:

the two E's are in the 1,4-, 1,5-, 1,8-, 2,3-, or 2,6- positions;

in Formula VII:

the two E's are in the 1,4-, 1,5-, 1,8-, 2,3-, 2,6-, or 9,10-positions;

in Formula VIII:

a first E is in the 1, 2, or 3 position, a second E is in the 6, 7, or 8 position;

in Formula IX:

a first E is in the 2, 3, or 4 position; a second E is in the 7, 8, or 9 position; and in Formula XII:

R$^2$ is selected from hydrogen, alkyl, aryl, heteroalkyl and heteroaryl;

δ is 0 or an integer from 1 to 12.

The invention is further directed to an organic electronic device having at least one electroactive layer comprising the above copolymer.

As used herein, the term "alkyl" is intended to mean a group derived from an aliphatic hydrocarbon, and includes, linear, branched and cyclic groups, which may be unsubstituted or substituted. The term "heteroalkyl" is intended to mean a group derived from an aliphatic hydrocarbon having at least one heteroatom in the main chain, which group may be unsubstituted or substituted. The term "aryl" is intended to mean a group derived from an aromatic hydrocarbon, which may be unsubstituted or substituted. The term "heteroaryl" is intended to mean a group derived from an aromatic group containing at least one heteroatom, which group may be unsubstituted or substituted. The term "arylene" is intended to mean a group derived from an aromatic hydrocarbon having two points of attachment, which group may be unsubstituted or substituted. The term "heteroarylene" is intended to mean a group derived from an aromatic group having at least one heteroatom and having two points of attachment, which group may be unsubstituted or substituted. The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond). The term "photoactive" refers to any material that exhibits electroluminescence and/or photosensitivity. The term "electroactive" refers to any material that exhibits hole transport/injection property, electron transport/injection property, electroluminescense, and/or photosensitivity. The term "monomeric unit" refers to a repeating unit in a polymer. In addition, the IUPAC numbering system is used throughout, where the groups from the Periodic Table are numbered from left to right as 1–18 (CRC Handbook of Chemistry and Physics, 81$^{st}$ Edition, 2000).

DETAILED DESCRIPTION OF THE PREFERRED EMBODIMENTS

The copolymers of the invention contain at least one of the first monomeric units and at least one of the second monomeric units described above.

In a first preferred embodiment, the copolymer does not include a vinylene monomeric unit. In a second preferred embodiment, the copolymer consists of optional suitable end-capping groups and at least one first monomeric units having Formula I and at least one second monomeric unit selected from Formula II, Formula II, Formula IV, Formula V, Formula VI, Formula VII, Formula Vil, Formula IX, Formula X, and Formula XI.

Figure 12:
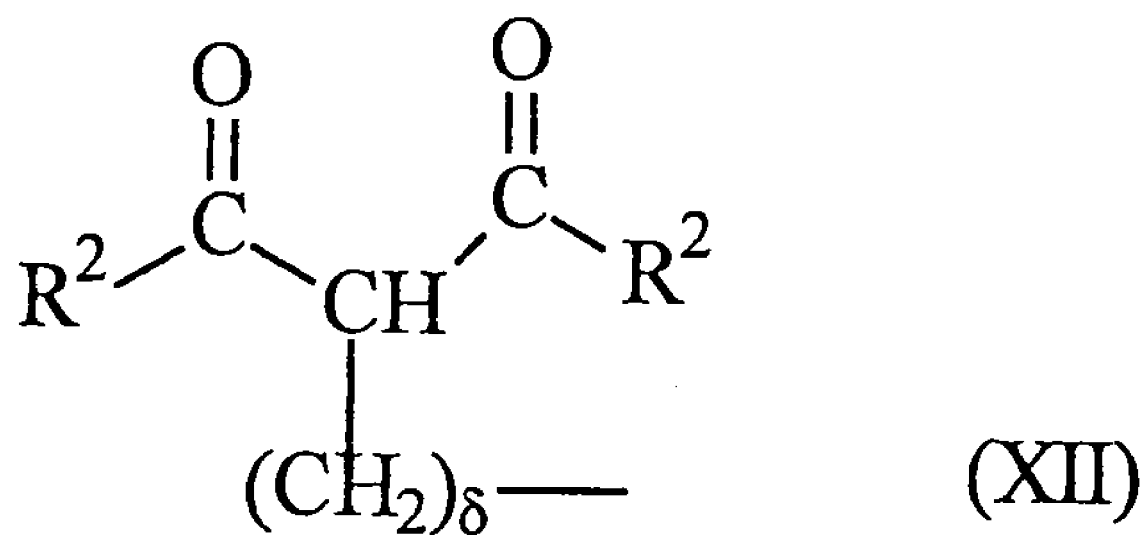
FIG. 12 shows Formula XII for a substituent for a second monomeric unit useful in the invention.

In a third preferred embodiment, each R group in each of Formula I, Formula II, Formula II, Formula IV, Formula V, Formula VI, Formula VII, Formula VIII, Formula IX, Formula X, and Formula XI is selected from:
hydrogen;
alkyl;
aryl;
heteroalkyl;
heteroaryl;
F;
—CN;
—P($R^1$)$_2$, —SO$R^1$, where $R^1$ is a substituent on a heteroatom which can be the same or different at each occurrence and is selected from alkyl, aryl, heteroalkyl and heteroaryl;
—NO$_2$;
a beta-dicarbonyl having Formula XII shown in FIG. 12 and as further described above;
—C$_\psi$H$_\theta$F$_\lambda$;
—OC$_\psi$H$_\theta$F$_\lambda$;
—O$R^1$, —CO$_2R^1$, —S$R^1$, —N($R^1$)$_2$, and —SO$_2R^1$ where $R^1$ is a straight chain or branched alkyl of between 1 and 20 carbons or a straight chain or branched heteroalkyl; or adjacent R groups together can form a 5- or 6-membered ring selected from cycloalkyl rings, aryl rings and heteroaryl rings. In an embodiment where adjacent R groups together form a 5- or 6-membered rings selected from aryl rings and heteroaryl rings, the aryl rings and heteroaryl rings are preferably unsubstituted.

First Monomeric Unit

Figure 1:
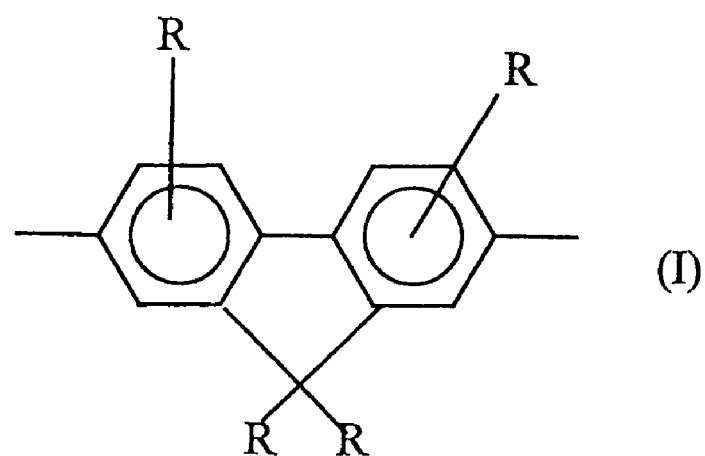
FIG. 1 shows Formula I and Formula I(a) for the first monomeric unit useful in the invention.

The first monomeric unit is a fluorene-based unit having a Formula I shown in FIG. 1. The preferred R groups are alkyl groups having 1 to 30 carbon atoms, heteroalkyl groups having 1–30 carbon atoms and one or more heteroatoms of S, N, or O, aryl groups having from 6 to 20 carbon atoms, and heteroaryl groups having from 2 to 20 carbon atoms and one or more heteroatoms of S, N, or O. Examples of suitable R groups include n- and iso-butyl, pentyls, both linear and branched, hexyls, octyls, including 2-ethylhexyl, up through hexadecyls and above, with and without olefinic unsaturation; phenyl, thiophene, carbazole, alkoxy, phenoxy and cyano groups. More preferred R groups on the carbon atom in the 9-position of the fluorene monomeric unit are linear and branched $C_6$ through $C_{12}$ alkyls. More preferred R groups on the phenyl rings of the fluorene monomeric unit are H, $C_6$–$C_{12}$ alkoxy, phenoxy, $C_6$–$C_{12}$ alkyl, phenyl or cyano.

An example of a suitable first monomeric unit is shown in FIG. 1 as Formula I(a).

Second Monomeric Unit

The second monomeric unit can be selected from Formulae II through XI as described below.

Figure 2:
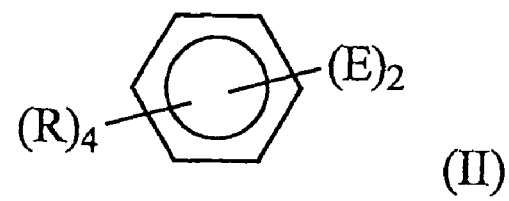
FIG. 2 shows Formula II for the second monomeric unit useful in the invention.

Formula II:

The second monomeric unit can be an aromatic group having the structure shown in FIG. 2, Formula II. The R groups are preferably selected from hydrogen;
alkyl;
aryl;
heteroalkyl;
heteroaryl;
F;
—CN;
—NO$_2$;
a beta-dicarbonyl having Formula XII shown in FIG. 12 and as further described above;
—C$_\psi$H$_\theta$F$_\lambda$;
—OC$_\psi$H$_\theta$F$_\lambda$; and
—P($R^1$)$_2$, —SO$R^1$, —O$R^1$, —CO$_2R^1$, —S$R^1$, —N($R^1$)$_2$, and —SO$_2R^1$ where $R^1$ is a straight chain or branched alkyl of from 1 to 20 carbons or a straight chain or branched heteroalkyl; or adjacent R groups together can form a 5- or 6-membered ring selected from cycloalkyl rings, aryl rings and heteroaryl rings.

Altnernatively, R groups in Formula II are selected from:
  partially or fully fluorinated alkyl groups having from 1 to 12 carbon atoms, especially $CF_3$;
  alkoxy groups having from 1 to 12 carbon atoms; esters having from 3 to 15 carbon atoms;
  $—SR^1$, $—N(R^1)_2$, $—P(R^1)_2$, $—SOR^1$, $—SO_2R^1$, where $R^1$ is an alkyl group having from 1 to 12 carbon atoms;
  $—NO_2$; and
  beta-dicarbonyls having Formula XII shown in FIG. 12, where:
    in Formula XII:
    R is an alkyl group having from 1 to 12 carbon atoms and δ is 0, 1, or 2.

Figure 3:
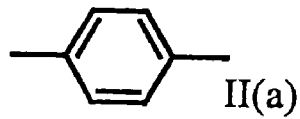
FIG. 3 shows Formulae II(a) through II(j) for a second monomeric unit useful in the invention.
Figure 3:
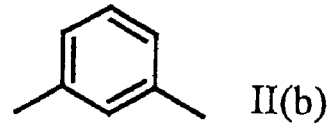
Figure 3:
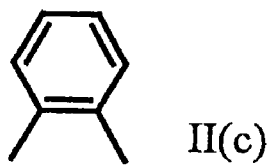
Figure 3:
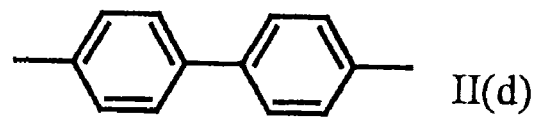
Figure 3:
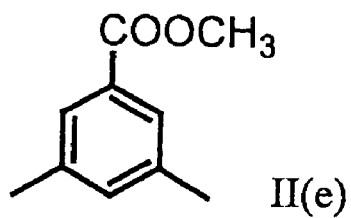
Figure 3:
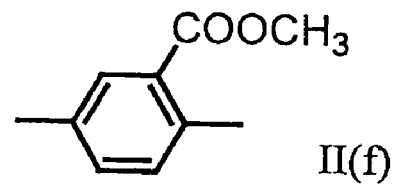
Figure 3:
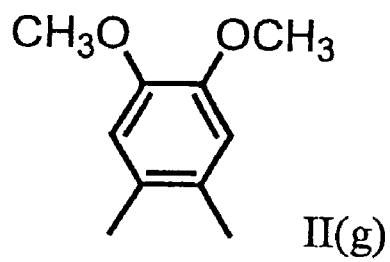
Figure 3:
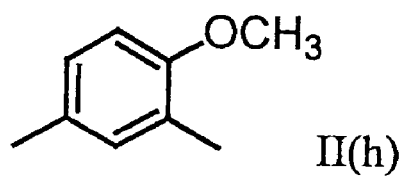
Figure 3:
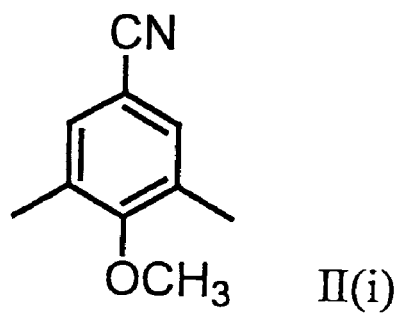
Figure 3:
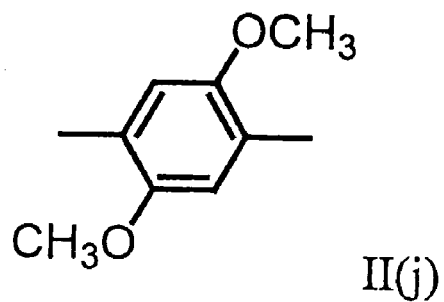
Figure 4:
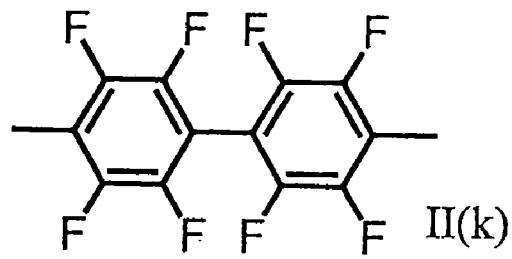
FIG. 4 shows Formulae II(k) through II(s) for a second monomeric unit useful in the invention.
Figure 4:
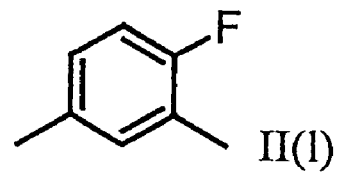
Figure 4:
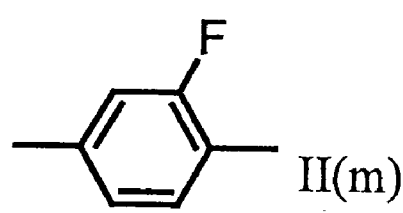
Figure 4:
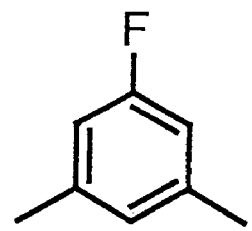
Figure 4:
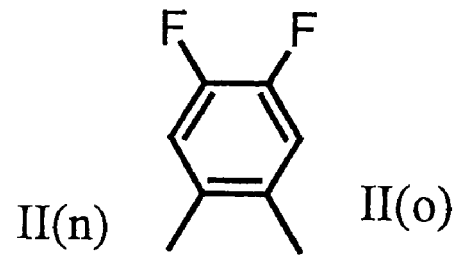
Figure 4:
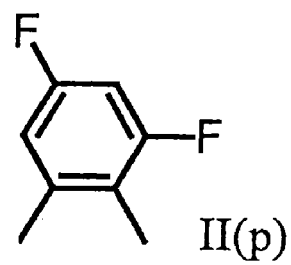
Figure 4:
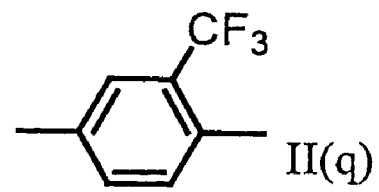
Figure 4:
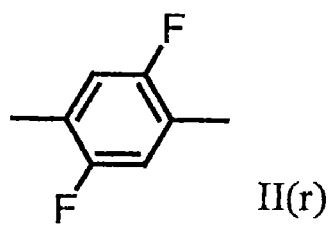
Figure 4:
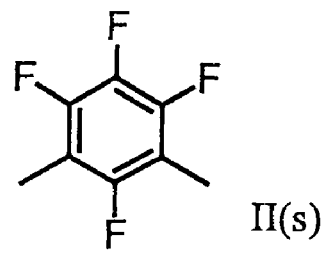
Figure 5:
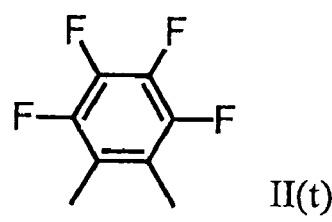
FIG. 5 shows Formulae II(t) through II(z) for a second monomeric unit useful in the invention.
Figure 5:
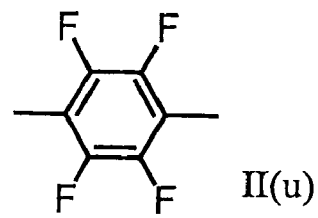
Figure 5:
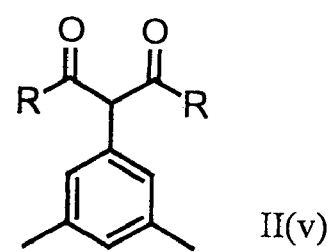
Figure 5:
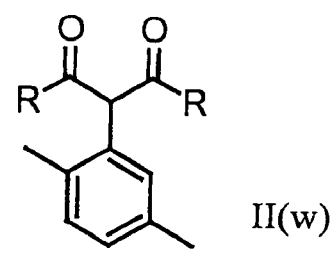
Figure 5:
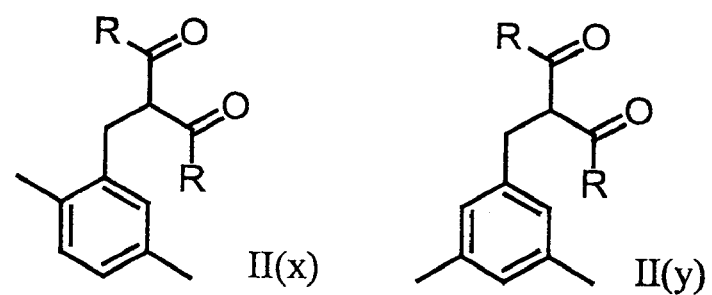
Figure 5:
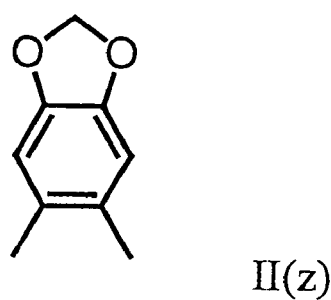

Examples of suitable second monomeric units with Formula II are shown in FIGS. 3 through 5 as Formulae II(a) through II(z) where:
  in Formulae II(v) through II(y):
    R is as described above for each of Formulae I, II, III, IV, V, VI, VII, VIII through XI.

Formula III:
  Alternatively, the second monomeric unit can be a divalent 6-membered-ring heteroaromatic group having the structure shown in FIG. 6, Formula III. Preferred R groups are hydrogen, $C_6$–$C_{12}$ alkyl groups, $C_6$–$C_{20}$ aryl groups, and $C_2$–$C_{20}$ heteroaryl groups. Examples of suitable E linking groups include pyridinediyl ($—C_5H_4N—$) and bipyridinediyl ($—C_5H_4N—C_5H_4N—$).

Figure 6:
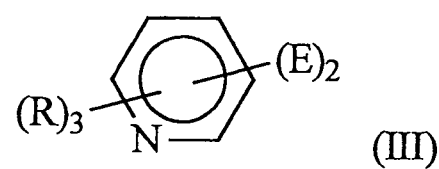
FIG. 6 shows Formula III and Formulae III(a) through III(g) for a second monomeric unit useful in the invention.
Figure 6:
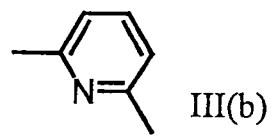
Figure 6:
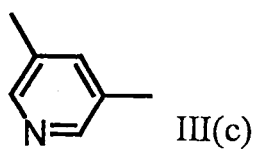
Figure 6:
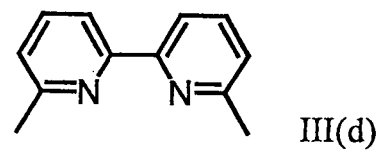
Figure 6:
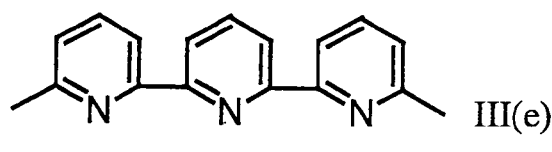
Figure 6:
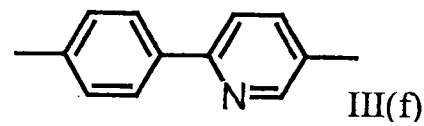
Figure 6:
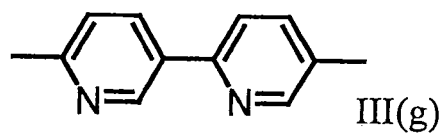

Examples of suitable second monomeric units having Formula III are shown in FIG. 6 as Formulae III(a) through 111(g).

Formula IV:
  Alternatively, the second monomeric unit can be a 5-membered-ring heteroaromatic group having the structure shown in FIG. 7, Formula IV. Preferred R groups are hydrogen, $C_1$–$C_{12}$ alkyl groups (alternatively, $C_1$–$C_5$ alkyl groups or $C_6$–$C_{12}$ alkyl groups), $C_6$–$C_{20}$ aryl groups, and $C_2$–$C_{20}$ heteroaryl groups, more preferably $C_6$–$C_{12}$ aryl groups. Examples of suitable E linking groups include pyrrolediyl ($—C_4H_3N—$) and thiophenediyl ($—C_4H_3S—$).

Figure 7:
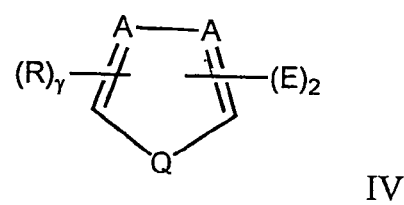
FIG. 7 shows Formula IV and Formulae IV(a) through IV(h) for a second monomeric unit useful in the invention.
Figure 7:
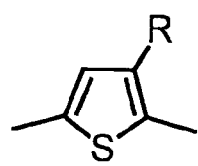
Figure 7:
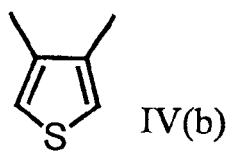
Figure 7:
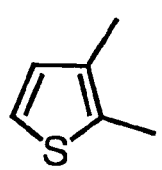
Figure 7:
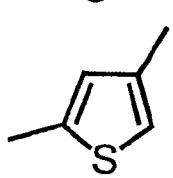
Figure 7:
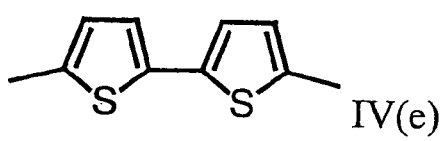
Figure 7:
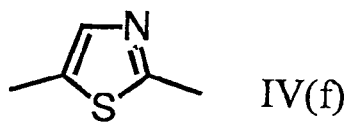
Figure 7:
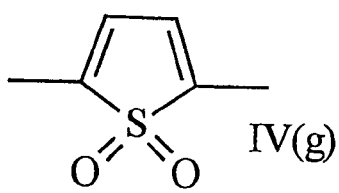
Figure 7:
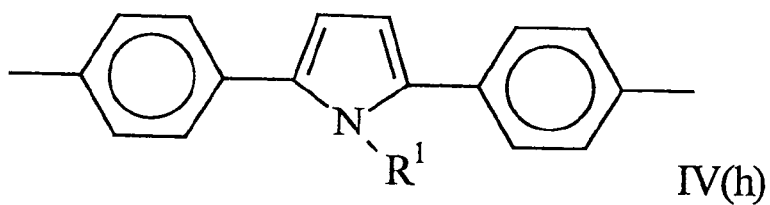

Examples of suitable second monomeric units with Formula IV are shown in FIG. 7 as Formulae IV(a) through IV(h), where:
  in Formula IV(a):
    R is as described above for each of Formulae I, II, III, IV, V, VI, VII, VIII through XI; and
  in Formula IV(h):
    $R^1$ is a substituent on a heteroatom which can be the same or different at each occurrence and is selected from alkyl, aryl, heteroalkyl and heteroaryl.

Figure 8:
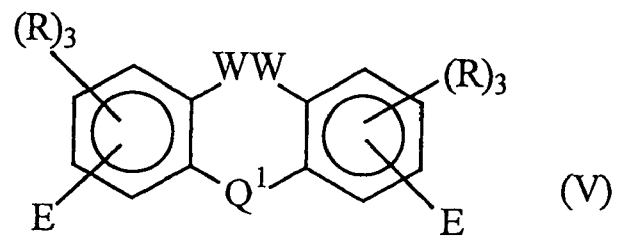
FIG. 8 shows Formula V and Formulae V(a) through V(e) for a second monomeric unit useful in the invention.
Figure 8:
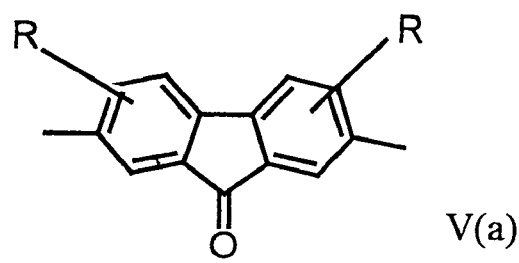
Figure 8:
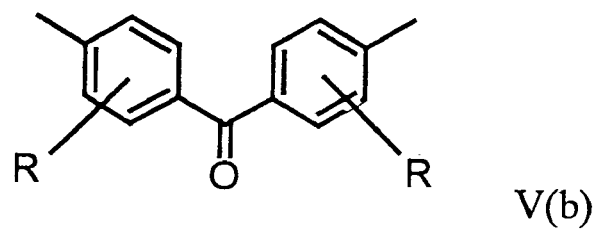
Figure 8:
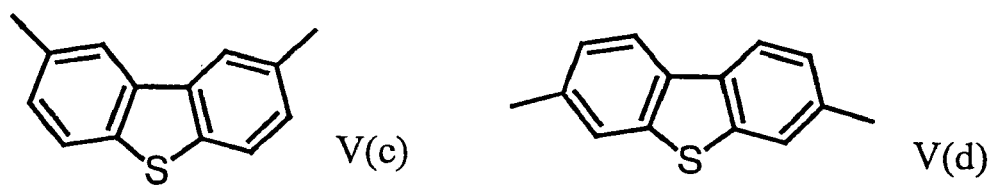
Figure 8:
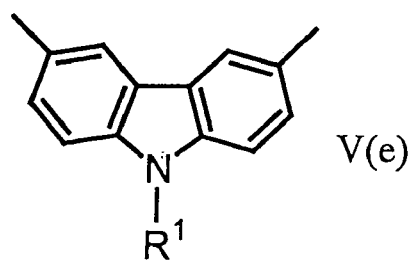

Formula V:
  Alternatively the second monomeric unit can be an aromatic having the structure shown in FIG. 8, Formula V. The R groups are preferably hydrogen, $C_1$–$C_{12}$ alkyl groups (alternatively, $C_1$–$C_4$ alkyl groups or $C_6$–$C_{12}$ alkyl groups), $C_6$–$C_{20}$ aryl groups, and $C_2$–$C_{20}$ heteroaryl groups. Preferably the two W represent one single bond.

Examples of suitable second monomeric units of this type are those having the structure of Formulae V(a) through Formula V(e) where:
  in Formulae V(a), V(b):
    R is as described above for each of Formulae I, II, III, IV, V, VI, VII, VIII through XI; and In Formula V(e):
    $R^1$ is a substituent on a heteroatom which can be the same or different at each occurrence and is selected from alkyl, aryl, heteroalkyl and heteroaryl.

Formulae VI through XI:
  Alternatively the second monomeric unit can be a divalent fused ring aromatic group having the structure shown in FIG. 9, Formula VI, FIG. 10, Formula VII, and FIG. 11, Formulae VII through XI. The R groups are preferably hydrogen, $C_6$–$C_{12}$ alkyl groups, $C_6$–$C_{20}$ aryl groups, and $C_2$–$C_{20}$ heteroaryl groups.

Figure 9:
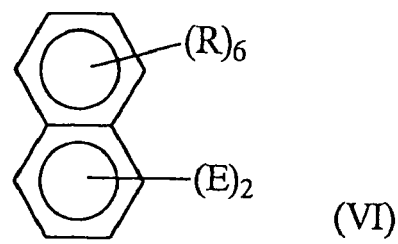
FIG. 9 shows Formulae VI and Formulae VI(a) through VI(d) for a second monomeric unit useful in the invention.
Figure 9:
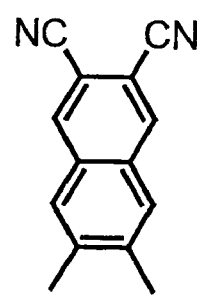
Figure 9:
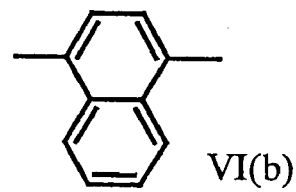
Figure 9:
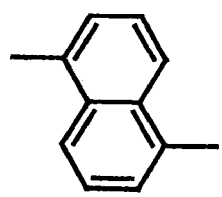
Figure 9:
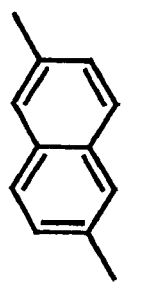

In Formula VI, the E's are preferably in the 1,4-, 1,5-, 1,8-, 2,3-, or 2,6-positions. Examples of suitable second monomeric units having Formula VI are shown in FIG. 9, Formulae VI(a) through VI(d).

Figure 10:
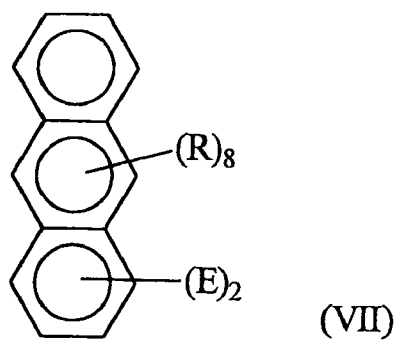
FIG. 10 shows Formula VII and Formula VI (a) for a second monomeric unit useful in the invention.
Figure 10:
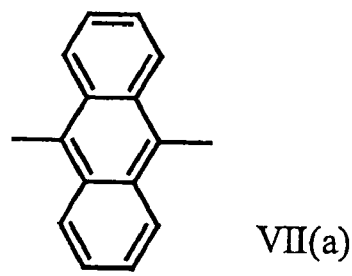
Figure 11:
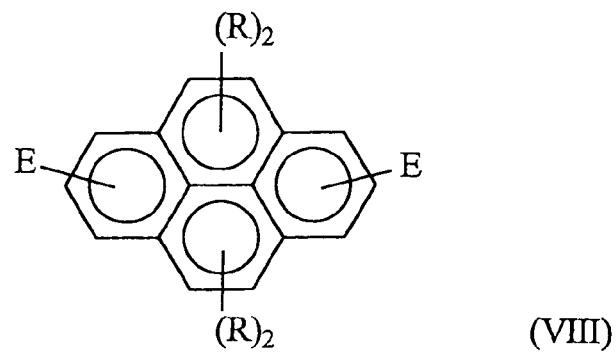
FIG. 11 shows Formulae VIII through XI for a second monomeric unit useful in the invention.
Figure 11:
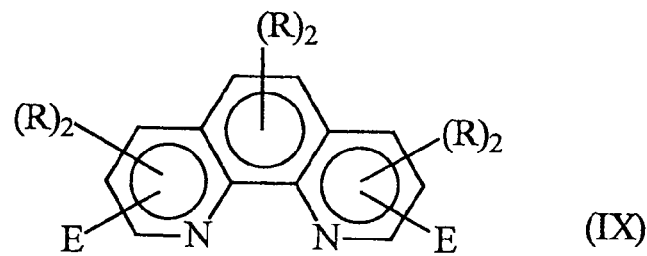
Figure 11:
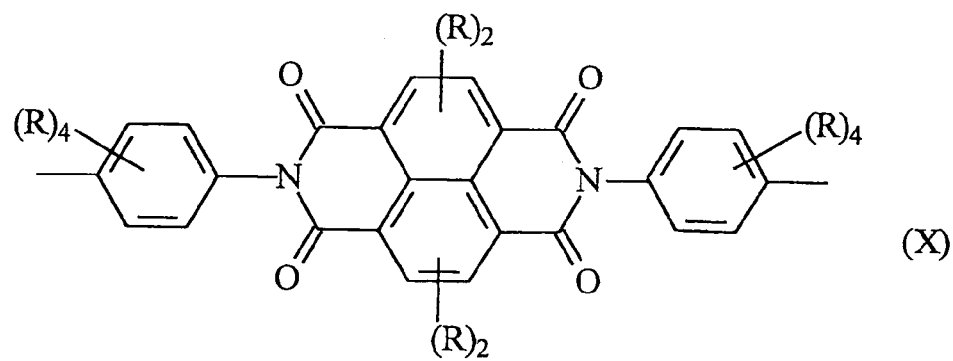
Figure 11:
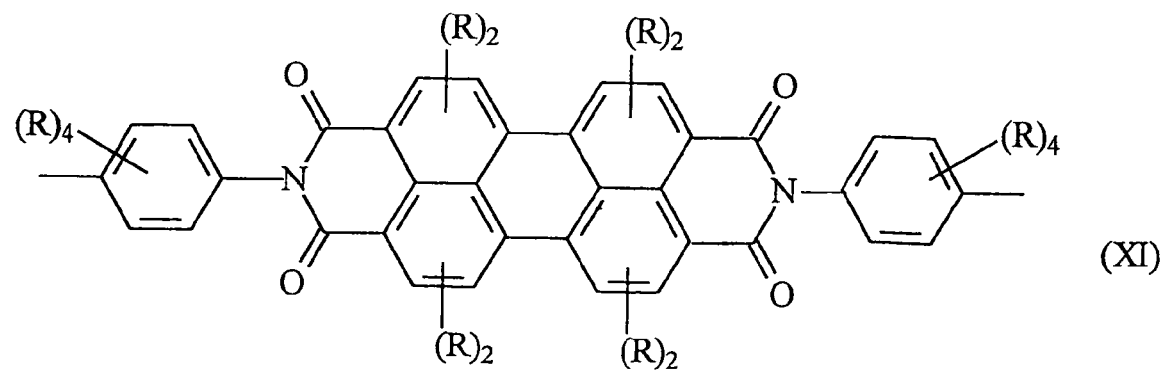

In Formula VII, the E's are preferably in the 1,4-, 1,5-, 1,8-, 2,3-, 2,6-, or 9,10-positions. An example of a suitable second monomeric unit having Formula VII is shown in FIG. 10, Formula VII(a).

In the copolymers of the invention, the R groups are essentially side chains off the polymeric backbone. Thus, the final selection of the R groups should take into account the role these side chains may play in the properties of the final polymer. These properties include electronic properties, solubility properties, processibility properties, film-forming properties, to enhance or to reduce interchain interaction, to induce solubility in organic solvents, to induce compatibility in blends with host polymers, to induce high dielectric constant so as to solvate ions, to enhance ionic mobility, etc. In addition, where the R groups are substituted, steric effects of such substituents should be considered in substituent selection.

In the copolymer of the invention, more than one of the second monomeric units can be present with the first monomeric unit. The relative molar proportion of first monomeric unit to the at least one second monomeric unit(s) can be from 99.9:0.1 to 1:99 or 99.5:0.5 to 10:90; alternatively 99:1 to 20:80, and further alternatively 99:1 to 50:50. The incorporation of the monomers in the formation of the polymer can be random or controlled, resulting in copolymers which include, but are not limited to, random copolymers, alternating copolymers and block copolymers.

Synthesis

The copolymers of the invention can generally be prepared by three known synthetic routes. In the first synthetic method, as described in Yamamoto, Progress in Polymer Science, Vol. 17, p 1153 (1992), the dihalo derivatives of the monomeric units are reacted with a stoichiometric amount of a zerovalent nickel compound, such as bis(1,5-cyclooctadiene)nickel(0). In the second method, as described in Colon et al., Journal of Polymer Science, Part A, Polymer chemistry Edition, Vol. 28, p. 367 (1990). The dihalo derivatives of the monomeric units are reacted with catalytic amounts of Ni(II) compounds in the presence of stoichiometric amounts of a material capable of reducing the divalent nickel ion to zerovalent nickel. Suitable materials include zinc, magnesium, calcium and lithium. In the third synthetic method, as described in U.S. Pat. No. 5,962,631, and published PCT application WO 00/53565, a dihalo derivative of one monomeric unit is reacted with a derivative of another monomeric unit having two reactive groups selected from boronic acid, boronic acid esters, and boranes, in the presence of a zerovalent palladium catalyst, such as tetrakis(triphenylphosphine)Pd.

In some embodiments of the invention, the copolymer can be reacted with an end-capping compound to convert the reactive end group to a non-reactive end group. The end-capping compound is generally added to a preformed polymer and ends the polymerization reaction. The end-capping compound is generally an aromatic compound having a single reactive group, such as an aromatic ring having a single halide group or boronic acid or ester group. Examples of suitable end-capping compounds include 9-bromoanthracene, 4-bromo-1,2-dimethoxybenzene, 1-bromopyrene, iodobenzene, bromobenzene, 2-bromo-9-fluorenone, and benzeneboronic acid. The end-capping group may also be designed to add functionality, such as charge transport properties and color shifting. It may also affect interchain aggregation.

Electronic Device

Figure 13:
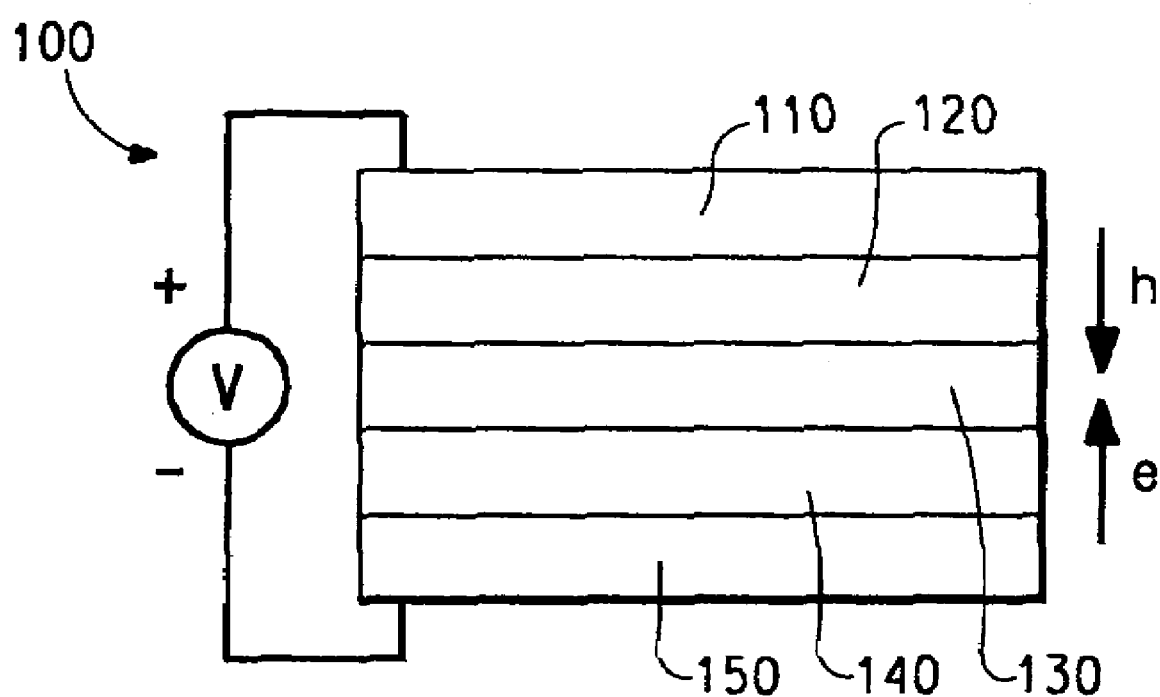
FIG. 13 is a schematic diagram of an electronic device that can incorporate the copolymer of the invention.

The present invention also relates to an electronic device comprising at least one photoactive layer positioned between two electrical contact layers, wherein at least one of the electroactive layers of the device includes the copolymer of the invention. As shown in FIG. 13, a typical device 100 has an anode layer 110 and a cathode layer 150 and electroactive layers 120, 130 and optionally 140 between the anode 110 and cathode 150. Adjacent to the anode is a hole injection/transport layer 120. Adjacent to the cathode is an optional layer 140 comprising an electron injection/transport material. Between the hole injection/transport layer 120 and the cathode (or optional electron transport layer) is the photoactive layer 130. The copolymers of the invention can be useful in the hole injection/transport layer 120 and/or in the photoactive layer 130 and/or the optional electron injection/transport layer 140.

The device generally also includes a support (not shown) which can be adjacent to the anode or the cathode. Most frequently, the support is adjacent the anode. The support can be flexible or rigid, organic or inorganic. Generally, glass or flexible organic films are used as a support. The anode 110 is an electrode that is particularly efficient for injecting or collecting positive charge carriers. The anode is preferably made of materials containing a metal, mixed metal, alloy, metal oxide or mixed-metal oxide. Suitable metals include the Group 11 metals, the metals in Groups 4, 5, and 6, and the Group 8–10 transition metals. If the anode is to be light-transmitting, mixed-metal oxides of Groups 12, 13 and 14 metals, such as indium-tin-oxide, are generally used. The anode 110 may also comprise an organic material such as polyaniline as described in "Flexible light-emitting diodes made from soluble conducting polymer," Nature vol. 357, pp 477–479 (11 Jun. 1992).

The anode layer is 110 usually applied by a physical vapor deposition process or spin-cast process. The term "physical vapor deposition" refers to various deposition approaches carried out in vacuo. Thus, for example, physical vapor deposition includes all forms of sputtering, including ion beam sputtering, as well as all forms of vapor deposition such as e-beam evaporation and resistance evaporation. A specific form of physical vapor deposition which is useful is rf magnetron sputtering.

The copolymers of the invention may function as hole transport materials in layer 120. Other materials which may facilitate hole injection/transport include N,N'-diphenyl-N, N'-bis(3-methylphenyl)-[1,1'-biphenyl]-4,4'-diamine (TPD) and bis[4-(N,N-diethylamino)-2-methylphenyl](4-methylphenyl)methane (MPMP), and hole transport polymers such as polyvinylcarbazole (PVK), (phenylmethyl)polysilane, poly(3,4-ethylenedioxythiophene) (PEDOT), and polyaniline (PANI); electron and hole transporting materials such as 4,4'-N,N'-dicarbazole biphenyl (BCP); or light-emitting materials with good electron and hole transport properties, such as chelated oxinoid compounds, such as tris(8-hydroxyquinolato)aluminum ($Alq_3$).

The hole injection/transport layer 120 can be applied using any conventional means, including spin-coating, casting, and printing, such as gravure printing. The layer can also be applied by ink jet printing, thermal patterning, or physical vapor deposition.

In general, the anode 110 and the hole injection/transport layer 120 is patterned. It is understood that the pattern may vary as desired. The layers can be applied in a pattern by, for example, positioning a patterned mask or photoresist on the first flexible composite barrier structure prior to applying the first electrical contact layer material. Alternatively, the layers can be applied as an overall layer and subsequently patterned using, for example, a photoresist and wet chemical etching. The hole injection/transport layer can also be applied in a pattern by ink jet printing, lithography or thermal transfer patterning. Other processes for patterning that are well known in the art can also be used.

Depending upon the application of the device 100, the photoactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). Examples of photodetectors include photoconductive cells, photoresistors, photoswitches, phototransistors, and phototubes, and photovoltaic cells, as these terms are describe in Markus, John, *Electronics and Nucleonics Dictionary*, 470 and 476 (McGraw-Hill, Inc. 1966).

Where the device 100 is a light-emitting device, the photoactive layer 130 will emit light when sufficient bias voltage is applied to the electrical contact layers. The copolymers of the invention may be used in the light-emitting active layer 130. Other known light-emitting materials include small molecule materials such as those described in, for example, Tang, U.S. Pat. No. 4,356,429, Van Slyke et al., U.S. Pat. No. 4,539,507, the relevant portions of which are incorporated herein by reference. Alternatively, such materials can be polymeric materials such as those described in Friend et al. (U.S. Pat. No. 5,247,190), Heeger et al. (U.S. Pat. No. 5,408,109), Nakano et al. (U.S. Pat. No. 5,317,169), the relevant portions of which are incorporated herein by reference. The light-emitting materials may be dispersed in a matrix of another material, with and without additives, but preferably form a layer alone. The active organic layer generally has a thickness in the range of 50–500 nm.

Where the electronic device 100 is a photodetector, the photoactive layer 130 responds to radiant energy and produces a signal either with or without a biased voltage. Materials that respond to radiant energy and is capable of generating a signal with a biased voltage (such as in the case of a photoconductive cells, photoresistors, photoswitches, phototransistors, phototubes) include, for example, many conjugated polymers and electroluminescent materials. Materials that respond to radiant energy and are capable of generating a signal without a biased voltage (such as in the case of a photoconductive cell or a photovoltaic cell) include materials that chemically react to light and thereby generate a signal. Such light-sensitive chemically reactive materials include for example, many conjugated polymers and electro- and photo-luminescent materials. Specific examples include, but are not limited to, MEH-PPV ("Optocoupler made from semiconducting polymers", G. Yu, K. Pakbaz, and A. J. Heeger, *Journal of Electronic Materials*, Vol. 23, pp 925–928 (1994); and MEH-PPV Composites with CN-PPV ("Efficient Photodiodes from Interpenetrating Polymer Networks", J. J; M. Halls et al. (Cambridge group) *Nature* Vol. 376, pp. 498–500, 1995).

The photoactive layer 130 containing the active organic material can be applied from solutions by any conventional means, including spin-coating, casting, and printing. The active organic materials can be applied directly by vapor deposition processes, depending upon the nature of the materials. It is also possible to apply an active polymer precursor and then convert to the polymer, typically by heating.

The cathode 150 is an electrode that is particularly efficient for injecting or collecting electrons or negative charge carriers. The cathode can be any metal or nonmetal having a lower work function than the first electrical contact layer (in this case, an anode). Materials for the second electrical contact layer can be selected from alkalil metals of Group 1 (e.g., Li, Cs), the Group 2 (alkaline earth) metals, the Group 12 metals, the rare earths, the lanthanides, and the actinides. Materials such as aluminum, indium, calcium, barium, and magnesium, as well as combinations, can be used.

The cathode layer 150 is usually applied by a physical vapor deposition process. In general, the cathode layer will be patterned, as discussed above in reference to the anode layer 110 and conductive polymer layer 120. Similar processing techniques can be used to pattern the cathode layer.

Optional layer 140 can function both to facilitate electron transport, and also serve as a buffer layer or confinement layer to prevent quenching reactions at layer interfaces. Preferably, this layer promotes electron mobility and reduces quenching reactions. Examples of electron transport materials for optional layer 140 include metal chelated oxinoid compounds, such as tris(8-hydroxyquinolato)aluminum ($Alq_3$); phenanthroline-based compounds, such as 2,9-dimethyl-4,7-diphenyl-1,10-phenanthroline (DDPA) or 4,7-diphenyl-1,10-phenanthroline (DPA), and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ).

It is known to have other layers in organic electronic devices. For example, there can be a layer (not shown) between the conductive polymer layer 120 and the active layer 130 to facilitate positive charge transport and/or band-gap matching of the layers, or to function as a protective layer. Similarly, there can be additional layers (not shown) between the active layer 130 and the cathode layer 150 to facilitate negative charge transport and/or band-gap matching between the layers, or to function as a protective layer. Layers that are known in the art can be used. In addition, any of the above-described layers can be made of two or more layers. Alternatively, some or all of inorganic anode layer 110, the conductive polymer layer 120, the active layer 130, and cathode layer 150, may be surface treated to increase charge carrier transport efficiency. The choice of materials for each of the component layers is preferably determined by balancing the goals of providing a device with high device efficiency.

The device 100 can be prepared by sequentially depositing the individual layers on a suitable substrate. Substrates such as glass and polymeric films can be used. In most cases the anode is applied to the substrate and the layers are built up from there. However, it is possible to first apply the cathode to a substrate and add the layers in the reverse order. In general, the different layers will have the following range of thicknesses: inorganic anode 110, 500–5000 Å, preferably 1000–2000 Å; conductive polymer layer 120, 50–2500 Å, preferably 200–2000 Å; light-emitting layer 130, 10–1000 Å, preferably 100–800 Å; optional electron transport layer 140, 50–1000 Å, preferably 200–800 Å; cathode 150, 200–10000 Å, preferably 300–5000 Å.

EXAMPLES

The following examples illustrate certain features and advantages of the present invention. They are intended to be illustrative of the invention, but not limiting. All percentages are by weight, unless otherwise indicated.

Examples 1–5 and Examples 1A–5A

Examples 1–5 illustrate the preparation of the copolymers of the invention using dihalo monomers and zerovalent nickel. The copolymers were characterized by Nuclear Magnetic Resonance (NMR) and the number average molecular weights ($M_n$) determined by Gel Permeation Chromatography (GPC).

Example 1

Under inert conditions, DMF (5 ml) was added to a 50 ml Schlenck tube equipped with a stirring bar and containing bis(1,5-cyclooctadiene)nickel(0) (1.23 g, 4.48 mmol), 2,2'-bipyridyl (0.70 g, 4.48 mmol), and 1,5-cyclooctadiene (0.48 g, 4.48 mmol). The ensuing deep blue/purple solution was stirred at 60° C. for 30 minutes, and then a solution of a first monomer, 2,7-diiodo-9,9-bis(2-ethylhexyl)fluorene (1.08 g, 1.68 mmol) and a second monomer, 2,5-bis(p-bromophenyl)-N-(p-hexylphenyl)pyrrole (0.30 g, 0.56 mmol) in toluene (20 ml) was added via syringe. The reaction mixture was then stirred at 75° C. for 5 days. The mixture was cooled to room temperature and precipitated into a solution of methanol (100 ml), acetone (100 ml) and concentrated hydrochloric acid (5 ml). After stirring for 2 hours, the mixture was filtered. The solid residue was then dissolved in chloroform, and again precipitated into a solution of methanol (100 ml), acetone (100 ml) and concentrated hydrochloric acid (5 ml). After stirring for 1 hour, the mixture was filtered. Finally the residue was successively washed with methanol, water and methanol and dried in vacuo. The molecular weight is given in Table 1 below.

Example 1A

The procedure of Example 1 was repeated, except that the reaction mixture was stirred at 75° C. for 24 hours, instead of for 5 days. In addition, after the mixture was filtered, the resulting solid was again dissolved in chloroform and precipitated in pure methanol, before the residue was sucessively washed with methanol, water and methanol and dried in vacuo. Essentially the same molecular weight provided in Table 1 below were obtained.

Examples 2–5

The procedure of Example 1 was repeated using 2,7-dibromo-9,9-bis(2-ethylhexyl)fluorene as the first monomer and different second monomers, and with the addition of iodobenzene as an endcapping group. The reaction mixture without endcapper was heated with stirring for 4 days, the iodobenzene endcapper was added, and the mixture was stirred at 75° C. for another day. The copolymers are summarized in Table 1 below.

Examples 2A-5A

The procedure of Examples 2–5 was repeated, except that bromobenzene was added instead of iodobenzene as an endcapping group. The reaction mixutre was heated with stirring for 24 hours instead of 4 days before the bromozene endcapper was added, and the mixture was stirred for another hour, instead of another day. The copolymers obtained were similar to those summarized in Table 1 below.

TABLE 1

Fluorene Copolymers

| Ex. | 1$^{st}$ monomer | 2$^{nd}$ monomer | Ratio* 1$^{st}$ to 2$^{nd}$ to endcap | $M_n$ |
|---|---|---|---|---|
| 1 | diiodo | 2,5-bis(p-bromophenyl)-N-(p-hexylphenyl)pyrrole | 3:1:0 | 47,200 |
| 2 | dibromo | methyl-3,5-dibromobenzoate | 10:1:1.1 | 68,700 |
| 3 | dibromo | methyl-2,5-dibromobenzoate | 10:1:1.1 | 98,400 |
| 4 | dibromo | 2,5-bis(4-bromophenyl) oxadiazole | 10:1:1.1 | 67,300 |
| 5 | dibromo | 2,7-dibromo-9-fluorenone | 10:1:1.1 | 60,900 |

*Ratio is the molar ratio of the starting materials

Examples 6 and 6A

This example illustrates the preparation of fluorene copolymers using a dihalo monomer, a diboronic acid ester monomer and a palladium catalyst.

Example 6

Under an argon atmosphere, toluene (10 ml) was added to a 50 ml Schlenck tube equipped with a stirring bar and containing 2,7-diiodo-9,9-bis(2-ethylhexyl) fluorene (1.07 g, 1.66 mmol) and 1,4-benzenediboronicacid bis(neopentyl glycol) cylic ester (0.50 g, 1.66 mmol). Then tetrakis(triphenylphosphine)palladium(0) (19 mg, 0.0166 mmol) and a degassed aqueous potassium carbonate solution (2M, 7.0 ml) were added to the tube. The solution was heated in an oil bath at 100° C. for 48 hours with vigorous stirring. The end-capper, 4-methylbenzeneboronic acid (50 mg, 0.33 mmol), was added and the mixture heated with stirring for an additional 12 hours. The mixture was cooled to room temperature, and then precipitated into a solution of methanol (100 ml), acetone (100 ml) and concentrated hydrochloric acid (5 ml). After stirring for 2 hours, the mixture was filtered. The solid residue was then dissolved in chloroform, and again precipitated into a solution of methanol (100 ml), acetone (100 ml) and concentrated hydrochloric acid (5 ml). After stirring for 1 hour, the mixture was filtered. Finally the residue was successively washed in methanol, water and methanol and dried in vacuo. The resulting copolymer had a molecular weight ($M_n$) of 8800.

Example 6A

Under an argon atmosphere, toluene (10 ml) was added to a 50 ml Schlenck tube equipped with a stirring bar and containing 2,7-diiodo-9,9-bis(2-ethylhexyl) fluorene (1.07 g, 1.66 mmol) and 1,4-benzenediboronicacid bis(neopentyl glycol) cylic ester (0.50 g, 1.66 mmol). Then tetrakis(triphenylphosphine)palladium(0) (19 mg, 0.0166 mmol) and a degassed aqueous potassium carbonate solution (2M, 7.0 ml) were added to the tube. The solution was heated in an oil bath at 100° C. for 48 hours with vigorous stirring. The first end-capper, benzeneboronic acid (50 mg, 0.33 mmol), was added and the mixture heated with stirring for an additional 1 hour. The second end-capper, bromobenzene (50 mg), was added and the mixture was heated and stirred for an additional hour. The mixture was then cooled to room temperature, and then precipitated into a solution of methanol. The mixture was filtered and the residue was washed with methanol and dried in vacuum. The resulting copolymer had a molecular weight ($M_n$) of 8800.

Example 7–17

The copolymers of Examples 1–5 above were tested as light-emitters in a light emitting diode having the layers illustrated in FIG. 13, with the modification of a substrate supporting the anode. The anode used was indium tin oxide (ITO), supported by a glass substrate. The hole injection/transport layer was spin-coated onto the ITO on glass substrate. The hole injection/transport layer was poly(3,4-ethylenedioxythiophene), PEDOT, (Baytron® P from Bayer, Germany) at a thickness of about 2000 Å or a bilayer of PEDOT and polyvinylcarbazole, PVK, at a total thickness of about 2000 Å. The copolymer was dissolved in toluene to form a 2.0% (w/v) solution, filtered through a 0.22 micron filter, and spin-coated over the hole injection/transport layer. The target thickness of the copolymer layer was 800 Å, with actual thicknesses typically in the range of 500 to 1000 Å.

For the cathode, Ba and Al layers were sequentially vapor deposited on top of the EL layers under a vacuum of $1 \times 10^{-6}$ torr. The final thickness of the Ba layer was 30 Å; the thickness of the Al layer was 3000 Å. Device performance was tested inside a dry box using a calibrated Si photodiode. The results are given in Table 2 below.

TABLE 2

| Example | EL Polymer | Hole Injection/ Transport | Voltage at 100 Cd/m$^2$ | Cd/A at 25 mA | Cd/A (at mA) | Cd/m$^2$ (at V) | QE % (at V) |
|---|---|---|---|---|---|---|---|
| 7 | Ex. 1 | PEDOT | | | | 849 (12 V) | 0.18 (12 V) |
| 8 | Ex. 1 | PEDOT/PVK | | | | 669 (14 V) | 0.11 (14 V) |
| 9 | Ex. 1 | PVK | | | | 3970 (14 V) | 0.62 (14 V) |
| 10 | Ex. 2 | PEDOT/PVK | 8.6 | 0.76 | 0.86 (34 mA) | | |
| 11 | Ex. 2 | PVK | 6.6 | 0.06 | 0.068 (55 mA) | | |

TABLE 2-continued

| Example | EL Polymer | Hole Injection/ Transport | Voltage at 100 Cd/m² | Cd/A at 25 mA | Cd/A (at mA) | Cd/m² (at V) | QE % (at V) |
|---|---|---|---|---|---|---|---|
| 12 | Ex. 3 | PEDOT/PVK | 9.1 | 1.19 | 1.22 (35 mA) | | |
| 13 | Ex. 3 | PVK | 6.9 | 0.2 | 0.22 (20 mA) | | |
| 14 | Ex. 4 | PEDOT/PVK | >10 | 0.68 | 0.87 (3 mA) | | |
| 15 | Ex. 4 | PVK | 9.1 | 0.46 | 0.50 (50 mA) | | |
| 16 | Ex. 5 | PEDOT/PVK | >10 | 1.14 | 3.74 (0.04 mA) | | |
| 17 | Ex. 5 | PVK | >10 | 1.2 | 1.5 (8 mA) | | |

While this invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent formulations and functions.

What is claimed is:

1. A copolymer consisting essentially of at least one first monomeric unit and at least one second monomeric unit, wherein the at least one first monomeric unit has a Formula I and I(a)

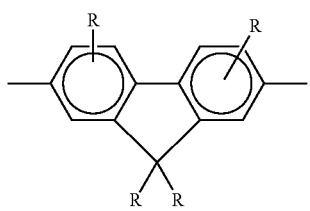

(I)

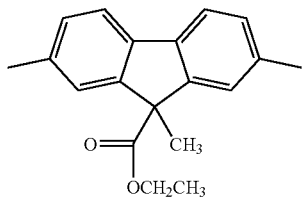

I(a)

and the at least one second monomeric unit is selected from fused ring aromatic groups having Formula VI,

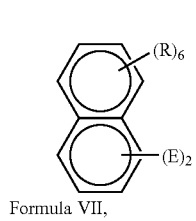

Formula VII, (VI)

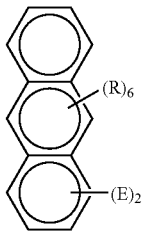

and Formula VIII (VII)

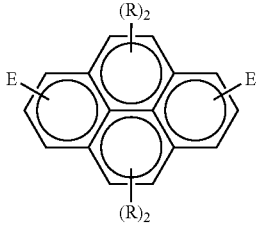

(VIII)

(IX)

(X)

(XI)

where:
in each of Formulae I, I(a), VI, VII, and VIII:
R is a substituent on a carbon atom which can be the same or different at each occurrence and is selected from hydrogen, alkyl, aryl, heteroalkyl, heteroaryl, F, —CN, —OR$^1$, —CO$_2$R$^1$, —C$_\psi$H$_\theta$F$_\lambda$, —OC$_\psi$H$_\theta$F$_\lambda$, —SR$^1$, —N(R$^1$)$_2$, —P(R$^1$)$_2$, —SOR$^1$, —SO$_2$R$^1$, —NO$_2$, and beta-dicarbonyls having Formula XII

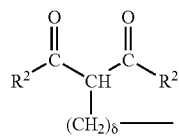

(XII)

wherein
R$^2$ is selected from hydrogen, alkyl, aryl, heteroalkyl and heteroaryl;
δ is 0 or an integer from 1 to 12, adjacent R groups together can form a single 5- or 6-membered cycloalkyl, aryl, or heteroaryl ring,
such that:
R$^1$ is a substituent on a heteroatom which can be the same or different at each occurrence and is selected from alkyl, aryl, heteroalkyl and heteroaryl; and
ψ is an integer between 1 and 20, and θ and λ are integers satisfying Equation A1 below:

$$\theta+\lambda=2\psi+1; \quad \text{(Equation A1)};$$

in each of Formulae VI, VII, and VIII:
E can be the same or different at each occurrence and is a single bond or a linking group selected from arylene and heteroarylene;
in Formula VI;
the two E's are in the 1,4-, 1,5-, 1,8-, 2,3-, or 2,6- positions;
in Formula VII;
the two E's are in the 1,4-, 1,5-, 1,8-, 2,3-, 2,6-, or 9,10- positions;
in Formula VIII;
a first E is in the 1, 2, or 3 position, a second E is in the 6, 7, or 8 position; and
with the proviso that when R in formulae VI, VII, and VIII is hydrogen, alkyl, F, —CN, —OR$^1$, or CO$_2$R$^1$ the copolymer further comprises end-capping groups that are aromatic;
and with the further proviso that said copolymer does not consist of 9,9-di-n-octylfluorene and unsubstituted naphthalene alternating copolymer.

2. The copolymer of claim 1, wherein R groups in one or more of the at least one first monomeric unit are independently selected from alkyl groups having 1 to 30 carbon atoms; heteroalkyl groups having 1–30 carbon atoms and one or more heteroatoms of S, N, or O; aryl groups having from 6 to 20 carbon atoms, and heteroaryl groups having from 2 to 20 carbon atoms and one or more heteroatoms of S, N, or O.

3. The copolymer of claim 1 that excludes any vinylene monomeric units.

4. The copolymer of claim 1 wherein each R group in each of Formula I, Formula 1(a), Formula VI, Formula VII, and Formula VIII is selected from:
hydrogen;
alkyl;
aryl;
heteroalkyl;
heteroaryl;
F;
—CN;
—P(R$^1$)$_2$ and —SOR$^1$, where R$^1$ is a substituent on a heteroatom which can be the same or different at each occurrence and is selected from alkyl, aryl, heteroalkyl and heteroaryl;
—NO$_2$;
a beta-dicarbonyl having Formula XII;
—C$_\psi$H$_\theta$F$_\lambda$;
—OC$_\psi$H$_\theta$F$_\lambda$; —OR$^1$, —CO$_2$R$^1$, —SR$^1$, —N(R$^1$)$_2$, and —SO$_2$R$^1$ where R$^1$ is a straight chain or branched alkyl of more than 20 carbons or a straight chain or branched heteroalkyl.

5. The copolymer of claim 1 wherein the at least one of the R groups in one or more of the at least one first monomeric unit is independently selected from linear and branched n-butyl groups; linear and branched iso-butyl groups; linear and branched pentyl groups; hexyl groups, and octyl groups with and without olefinic unsaturation; phenyl groups, thiophene groups, carbazole groups, alkoxy groups, phenoxy groups and cyano groups.

6. The copolymer of claim 1 wherein at least one of the R groups in one or more of the at least one first monomeric unit are independently selected from H, C$_6$–C$_{12}$ alkoxy, phenoxy, C$_6$–C$_{12}$ alkyl, phenyl and cyano.

7. The copolymer of claim 1 wherein one or more of the at least one second monomeric unit is selected from Formulae VI(a) through VI(d), and VII(a)

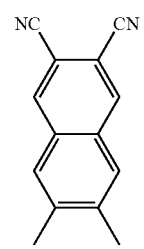

VI(a)

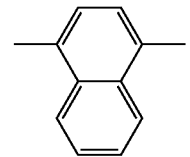

VI(b)

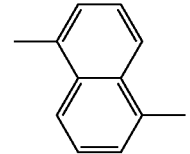

VI(c)

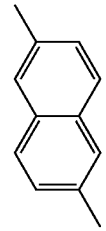

VI(d)

-continued

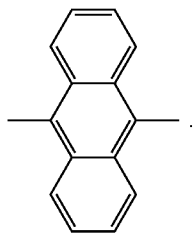

VII(a)

8. The copolymer of claim 1, wherein one or more of the at least one second monomeric unit has Formula VI, VII and VIII: wherein R is selected from:
partially or fully fluorinated alkyl groups having from 1 to 12 carbon atoms;
alkoxy groups having from 1 to 12 carbon atoms;
esters having from 3 to 15 carbon atoms;
$-SR^1$, $-N(R^1)_2$, $-P(R^1)_2$, $-SOR^1$, $-SO_2R^1$, where $R^1$ is an alkyl group having from 1 to 12 carbon atoms;
$-NO_2$; and
beta-dicarbonyls having Formula XII

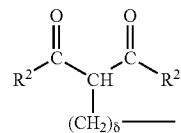

(XII)

where:
in formula XII:
$R^2$ is an alkyl group having from 1 to 12 carbon atoms and $\delta$ is 0, 1, or 2.

9. The copolymer of claim 1, wherein one or more of the at least one second monomeric unit has one of Formulae VI through VIII wherein:
R groups are H, $C_6$–$C_{12}$ alkyl groups, $C_6$–$C_{20}$ aryl groups, and $C_2$–$C_{20}$ heteroaryl groups; and
in Formula VI:
the E's are in the 1,4-, 1,5-, 1,8-, 2,3-, or 2,6- positions;
in Formula VII:
the E's are in the 1,4-, 1,5-, 1,8-, 2,3-, 2,6-, or 9,10- positions.

10. An electronic device comprising at least one electroactive layer comprising the copolymer of claim 1.

11. The device of claim 10, wherein the device comprises a hole injection/transport layer comprising the copolymer of claim 1.

12. The device of claim 10, wherein the device comprises an electron injection/transport layer comprising the copolymer of claim 1.

13. The device of claim 10 wherein the electroactive layer comprises a light-emitting material comprising the copolymer of claim 1.

14. The device of claim 10 wherein the device is selected from a light-emitting device, a photodetector, and a photovoltaic device.

15. The device of claim 10 wherein the device is an electroluminescent display.

16. A light-emitting device comprising at least one light-emitting layer comprising the copolymer consisting essentially of at least one first monomeric unit and at least one second monomeric unit, wherein the at least one first monomeric unit has a Formula I and I(a)

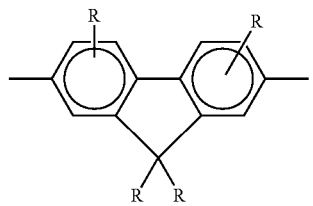

(I)

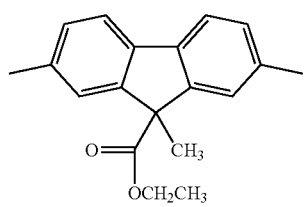

I(a)

and the at least one second monomeric unit is selected from fused ring aromatic groups having Formula VI,

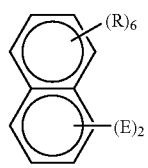

(VI)

Formula VII,

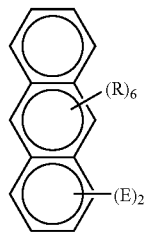

(VII)

and Formula VIII through Formula XI,

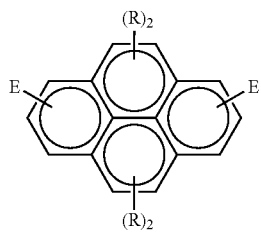

(VIII)

-continued

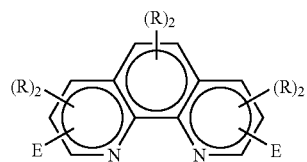
(IX)

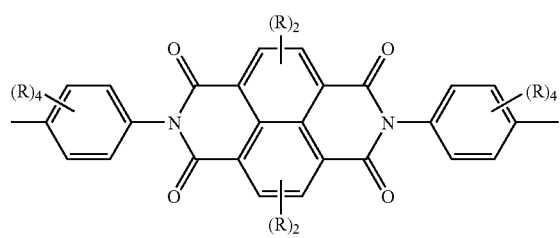
(X)

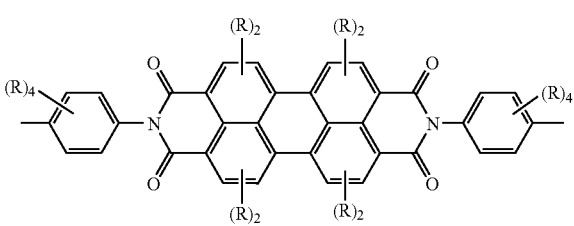
(XI)

where:

in each of Formulae I, I(a), VI, VII, VIII through XI:

R is a substituent on a carbon atom which can be the same or different at each occurrence and is selected from hydrogen, alkyl, aryl, heteroalkyl, heteroaryl, F, —CN, —OR$^1$, —CO$_2$R$^1$, —C$_\psi$H$_\theta$F$_\lambda$, —OC$_\psi$H$_\theta$F$_\lambda$, —SR$^1$, —N(R$^1$)$_2$, —P(R$^1$)$_2$, —SOR$^1$, —SO$_2$R$^1$, —NO$_2$, and beta-dicarbonyls having Formula XII

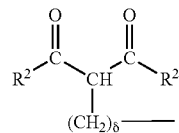
(XII)

wherein

R$^2$ is selected from hydrogen, alkyl, aryl, heteroalkyl and heteroaryl;

δ is 0 or an integer from 1 to 12 and adjacent R groups together can form a single 5- or 6-membered cycloalkyl, aryl, or heteroaryl ring, such that:

R$^1$ is a substituent on a heteroatom which can be the same or different at each occurrence and is selected from alkyl, aryl, heteroalkyl and heteroaryl; and ψ is an integer between 1 and 20, and θ and λ are integers satisfying Equation A1 below:

$$\theta + \lambda = 2\psi + 1;$$  (Equation A1);

in each of Formulae VI, VII, VIII, and XI:

E can be the same or different at each occurrence and is a single band or a linking group selected from arylene and heteroarylene;

in Formula VI:

the two E's are in the 1,4-, 1,5-, 1,8-, 2,3-, or 2,6- positions;

in Formula VII;

the two E's are in the 1,4-, 1,5-, 1,8-, 2,3-, 2,6-, or 9,10- positions;

in Formula VIII;

a first E is in the 1, 2, or 3 position, a second E is in the 6, 7, or 8 position;

in Formula IX; and a first E is in the 2, 3, or 4 position; a second E is in the 7, 8, or 9 position; and in Formula XII;

with the proviso that said copolymer does not consist of 9,9-di-n-octylfluorene and unsubstituted naphthalene alternating copolymer.

* * * * *